(12) United States Patent
Choi

(10) Patent No.: US 8,330,675 B2
(45) Date of Patent: Dec. 11, 2012

(54) ORGANIC LIGHT EMITTING DISPLAY

(75) Inventor: Howon Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 352 days.

(21) Appl. No.: 12/506,542

(22) Filed: Jul. 21, 2009

(65) Prior Publication Data

US 2010/0231126 A1 Sep. 16, 2010

(30) Foreign Application Priority Data

Mar. 13, 2009 (KR) .................. 10-2009-0021525

(51) Int. Cl.
*G09G 3/14* (2006.01)

(52) U.S. Cl. ............... 345/46; 345/39; 313/504; 257/40

(58) Field of Classification Search ............... 345/76–83, 345/104, 174, 204; 313/496, 504; 315/169.3; 257/40
See application file for complete search history.

(56) References Cited

U.S. PATENT DOCUMENTS

| | | | |
|---|---|---|---|
| 2004/0212765 A1* | 10/2004 | Kano et al. ............... | 349/114 |
| 2005/0122036 A1* | 6/2005 | Park et al. ............... | 313/504 |
| 2006/0180851 A1* | 8/2006 | Lee et al. ............... | 257/315 |
| 2007/0210697 A1* | 9/2007 | Tamura et al. ............... | 313/496 |
| 2008/0048989 A1 | 2/2008 | Yoon et al. | |
| 2008/0062148 A1* | 3/2008 | Hotelling et al. ............... | 345/174 |

* cited by examiner

Primary Examiner — Amare Mengistu
Assistant Examiner — Insa Sadio
(74) Attorney, Agent, or Firm — Morgan, Lewis & Bockius LLP

(57) ABSTRACT

An embodiment of this document provides an organic light emitting diode (OLED) display is provided. The OLED display includes a panel, a driving unit, and a sense unit. The panel includes subpixels, disposed on a first substrate, and electrode patterns disposed on one side of a second substrate. The first substrate and the second substrate are attached to each other, and the electrode patterns are disposed on a side of the second substrate that is facing the first substrate. The driving unit is coupled to the subpixels and configured to supply a scan signal and a data signal to the subpixels. The sense unit is coupled to the electrode patterns and configured to detect a position based on a change in the capacitance formed in the electrode patterns when a user touches the panel.

5 Claims, 8 Drawing Sheets

ORGANIC LIGHT EMITTING DISPLAY

This application claims the benefit of Korean Patent Application No. 10-2009-021525 filed on Mar. 13, 2009, which is hereby incorporated by reference.

BACKGROUND

1. Field

This document relates to an organic light emitting diode (OLED) display.

2. Related Art

An organic light emitting element used in an organic light emitting diode (OLED) is an emissive element in which an emission layer is formed between two electrodes disposed on a substrate.

The OLED comprises a top-emission method, a bottom-emission method, or a dual-emission method depending on a direction in which light is emitted. The OLED is also divided into a passive matrix method and an active matrix method depending on a driving method.

Each of subpixels arranged in the OLED comprises a transistor unit and an organic light-emitting diode. The transistor unit comprises a switching transistor, a driving transistor, and a capacitor. The organic light-emitting diode comprises an upper electrode, an organic light-emitting layer, and a lower electrode coupled to a driving transistor included in the transistor unit In the OLED, when a scan signal, a data signal, and power are supplied to a plurality of the subpixels arranged in a matrix form, selected subpixels emit light, thereby displaying an image.

Recently, there is an increasing demand for a touch screen panel (TSP) contrived to increase a user's convenience. Accordingly, there is a need for the development of an OLED to which the functions of the touch screen panel can be added.

SUMMARY

An embodiment of this document provides an organic light emitting diode (OLED) display comprising a panel, a driving unit, and a sense unit. The panel comprises subpixels, disposed on one side of a first substrate, and electrode patterns disposed on a second substrate. The first substrate and the second substrate are attached to each other, and the electrode patterns are disposed on a side of the second substrate that is facing the first substrate. The driving unit is coupled to the subpixels and configured to supply a scan signal and a data signal to the subpixels. The sense unit is coupled to the electrode patterns and configured to detect a position based on a change in the capacitance formed in the electrode patterns when a user touches the panel.

Another embodiment of this document provides an organic light emitting diode (OLED) display comprising a panel, a driving unit, and a sense unit. The panel comprises subpixels, disposed on one side of a first substrate, and electrode patterns disposed on a second substrate, wherein the first substrate and the second substrate are attached to each other, and wherein the electrode patterns are disposed on a side of the second substrate that opposites to the first substrate. The driving unit is coupled to the subpixels and configured to supply a scan signal and a data signal to the subpixels. The sense unit is coupled to the electrode patterns and configured to detect a position based on a change in the capacitance formed in the electrode patterns when a user touches the panel.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Hereinafter, implementations of this document will be described in detail with reference to the attached drawings.

Figure 1:
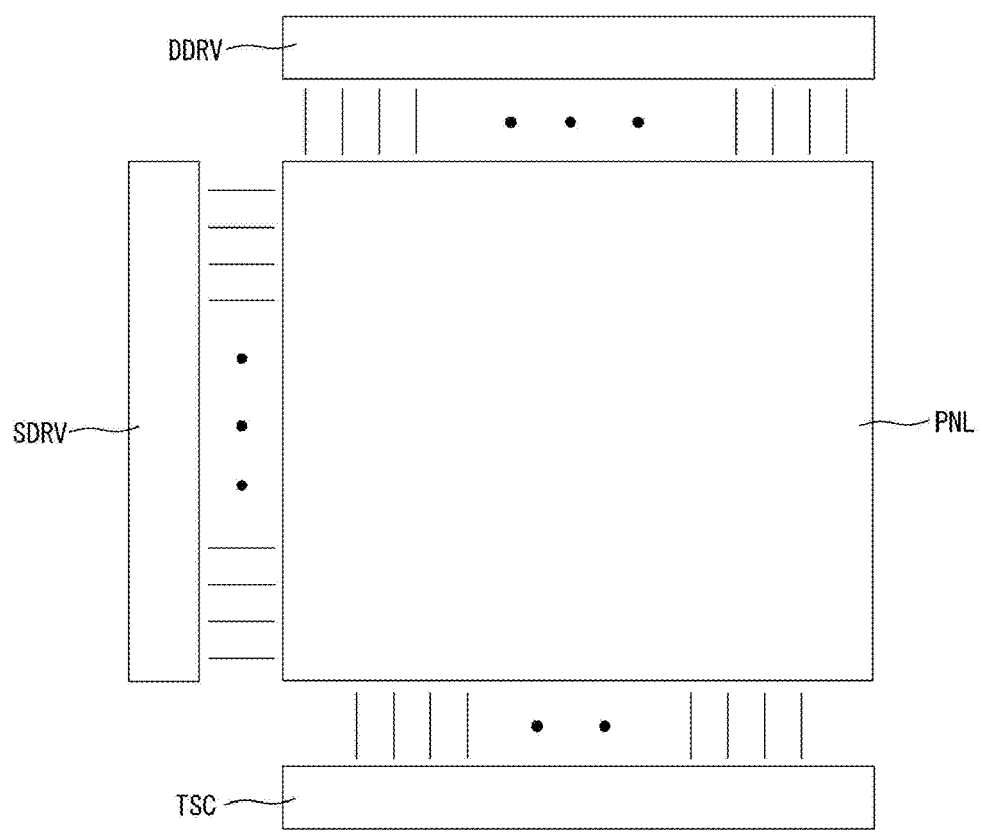
FIG. 1 is a schematic block diagram showing an organic light emitting diode (OLED) display according to an embodiment of this document.

Referring to FIG. 1, the organic light emitting diode (OLED) display comprises a panel PNL, a scan driving unit SDRV, a data driving unit DDRV, and a sense unit TSC.

The panel PNL comprises subpixels and electrode patterns. The scan driving unit SDRV is configured to supply scan signals to the subpixels included in the panel PNL. The data driving unit DDRV is configured to supply data signals to the subpixels included in the panel PNL. The sense unit TSC is configured to detect a position based on a change in the capacitance of capacitors (a change in the capacitance according to a dielectric constant) formed in the electrode patterns when a user touches the panel PNL.

Meanwhile, since the electrode patterns formed in the panel PNL are disposed in the direction of a display surface, they may be made of transparent material, such as ITO (Indium Tin Oxide), IZO (Indium Zinc Oxide), ITZO (Indium Tin Zinc Oxide), or AZO (ZnO doped $Al_2O_3$), but not limited thereto. The electrode patterns may have a one-dimensional single layer structure or a two-dimensional dual-layer structure, as shown in FIGS. 2 to 4.

Figure 2:
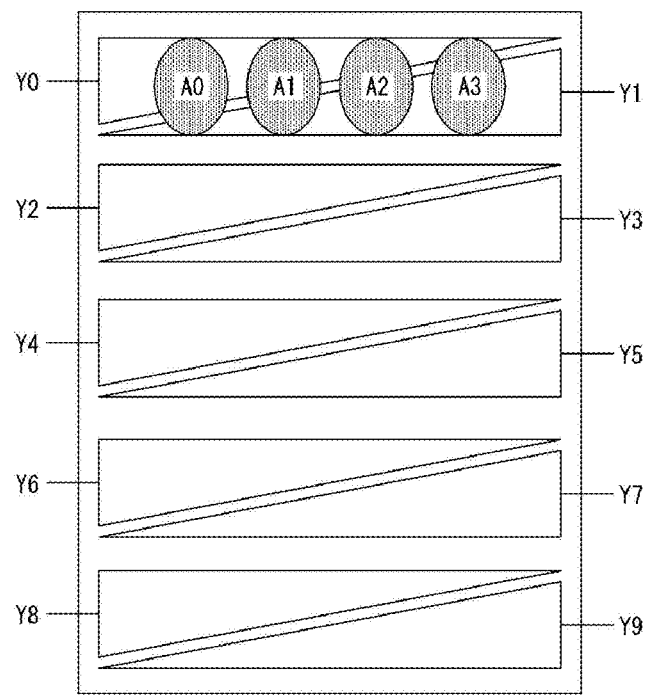
FIGS. 2 to 4 are exemplary views showing electrode patterns formed in FIG. 1.
Figure 3:
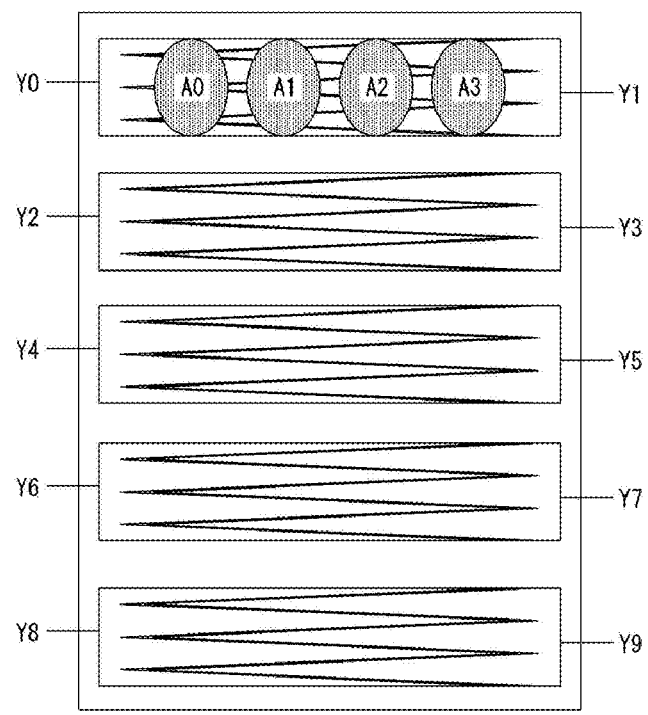

In the case where, as shown in FIGS. 2 and 3, the electrode patterns have a one-dimensional single layer structure, the electrode patterns may have a structure in which the electrode patterns are divided into electrode patterns Y0, Y2, Y4, Y6, and Y8 on one side and electrode patterns Y1, Y3, Y5, Y7, and Y9 on the other side, both of which are located on the same layer. Here, FIG. 2 is a diagram showing that the electrode patterns Y0, Y2, Y4, Y6, and Y8 on one side and the electrode patterns Y1, Y3, Y5, Y7, and Y9 on the other side are arranged according to the number of stages per line. FIG. 3 is a diagram showing that the electrode patterns Y0, Y2, Y4, Y6, and Y8 on one side and the electrode patterns Y1, Y3, Y5, Y7, and Y9 on the other side are arranged in plural numbers per line. In this structure, when a user touches a point A0, the sense unit TSC can detect a change in the capacitance, caused by the area of Y0 and the area of Y1, through the electrode patterns located in the touched area.

Figure 4:
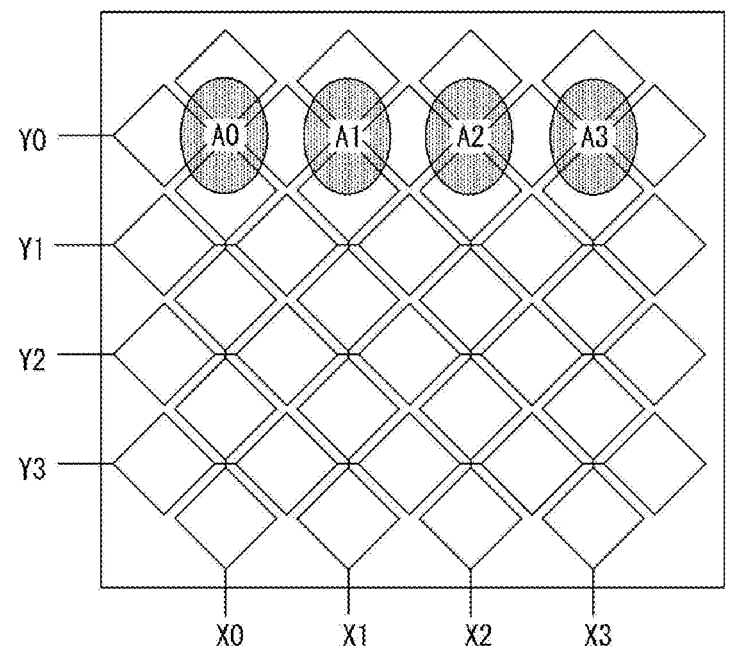

In the case where, as shown in FIG. 4, the electrode patterns have a two-dimensional dual-layer structure, the electrode patterns may have a structure in which the electrode patterns are divided into Y-axis electrode patterns Y0, Y1, Y2, and Y3 and X-axis electrode patterns X0, X1, X2, and X3 both of which are disposed in different layers. Here, FIG. 4 is a diagram showing that the Y-axis electrode patterns Y0, Y1, Y2, and Y3 and the X-axis electrode patterns X0, X1, X2, and X3 are arranged in a diamond form. In this structure, when a user touches a point A0, the sense unit TSC can detect a change in the capacitance, caused by the area of Y0 and the area of X0, through the electrode patterns located in the touched area.

Accordingly, the sense unit TSC can detect capacitance, changed according to the touch points A0, A1, A2, and A3 by a user, through the electrode patterns. Here, the above-described electrode patterns may have a different structure according to their positions. Accordingly, the sense unit TSC may convert data, input in the form of an analog signal, into a digital signal in order to use the change in the capacitance acquired from the electrode patterns.

The structure of the electrode patterns according to embodiments of this document is described below with reference to the cross section of the panel.

<First Embodiment>

Figure 5:
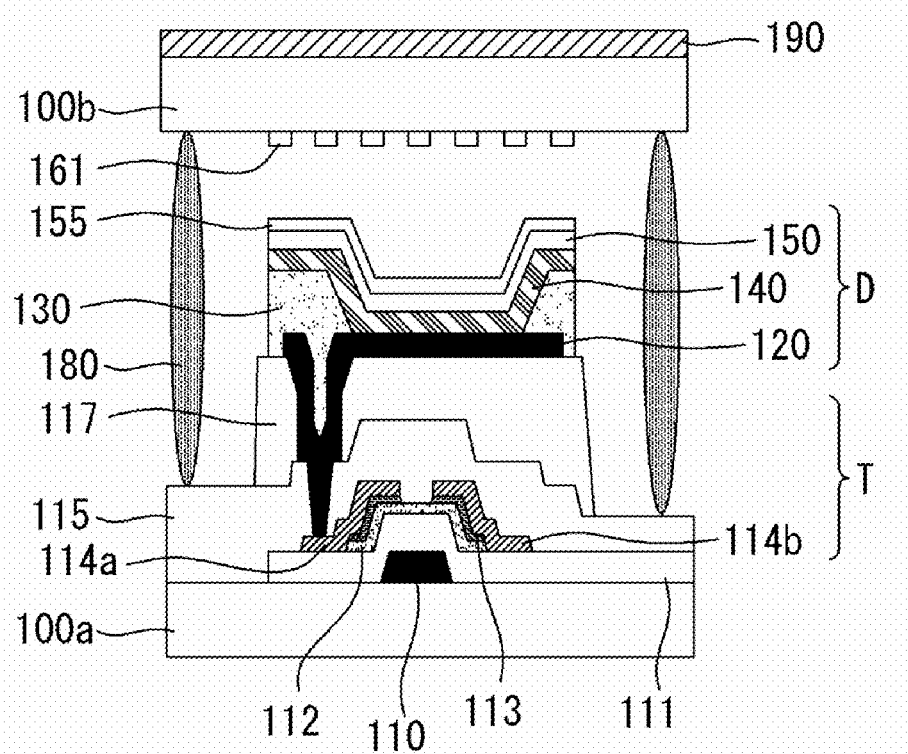
FIG. 5 is a diagram showing the structure of a panel according to a first embodiment of this document.

Referring to FIG. 5, the panel comprises subpixels, disposed on one side of a first substrate 100a, and lower electrode patterns 161 disposed on one side of a second substrate 100b (i.e., a side facing the subpixels). The first substrate 100a and the second substrate 100b are coalesced together and sealed by an adhesive member 180.

Meanwhile, the lower electrode patterns 161 are coupled to the sense unit as described above. Further, the lower electrode patterns 161 may be divided in plural numbers in respective lines corresponding to the subpixels, but not limited thereto. Here, the panel may comprise a protection layer 190 disposed on the other side of the second substrate 100b. The protection layer 190 may be made of a polarizing film, but not limited thereto. In the case where the lower electrode patterns 161 are disposed on one side of the second substrate 100b as described above, a buffer layer 155 made of organic material or an insulating film may be formed on an upper electrode 150 in order to prevent short between the lower electrode patterns 161 and the upper electrode 150. In this case, the buffer layer 155 may be omitted.

In the above embodiment, the lower electrode patterns 161 are illustrated to have a one-dimensional single layer structure. However, the shape of the lower electrode patterns 161 is not limited to the one-dimensional single layer structure.

<Second Embodiment>

Figure 6:
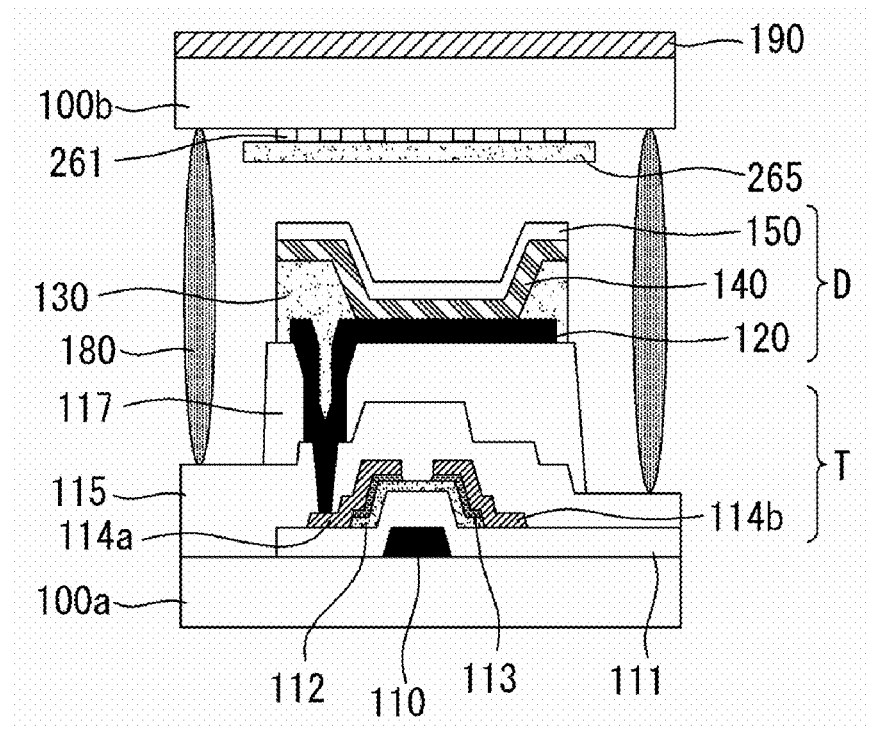
FIG. 6 is a diagram showing the structure of a panel according to a second embodiment of this document.

Referring to FIG. 6, the panel comprises subpixels, disposed on one side of a first substrate 100a, and lower electrode patterns 261 disposed on one side of a second substrate 100b (i.e., a side facing the subpixels). The first substrate 100a and the second substrate 100b are coalesced together and sealed by an adhesive member 180. The panel further comprises an insulating layer 265 disposed on the lower electrode patterns 261. Here, the insulating layer 26 may function to prevent short between the lower electrode patterns 261 and the upper electrode 150 of the subpixels when a user touches the panel.

Meanwhile, the lower electrode patterns 261 are coupled to the sense unit as described above. Further, the lower electrode patterns 261 may be divided in plural numbers in respective lines corresponding to the subpixels, but not limited thereto. Here, the panel may comprise a protection layer 190 disposed on the other side of the second substrate 100b. The protection layer 190 may be made of a polarizing film, but not limited thereto.

In the above embodiment, the lower electrode patterns 261 are illustrated to have a one-dimensional single layer structure. However, the shape of the lower electrode patterns 261 is not limited to the one-dimensional single layer structure.

<Third Embodiment>

Figure 7:
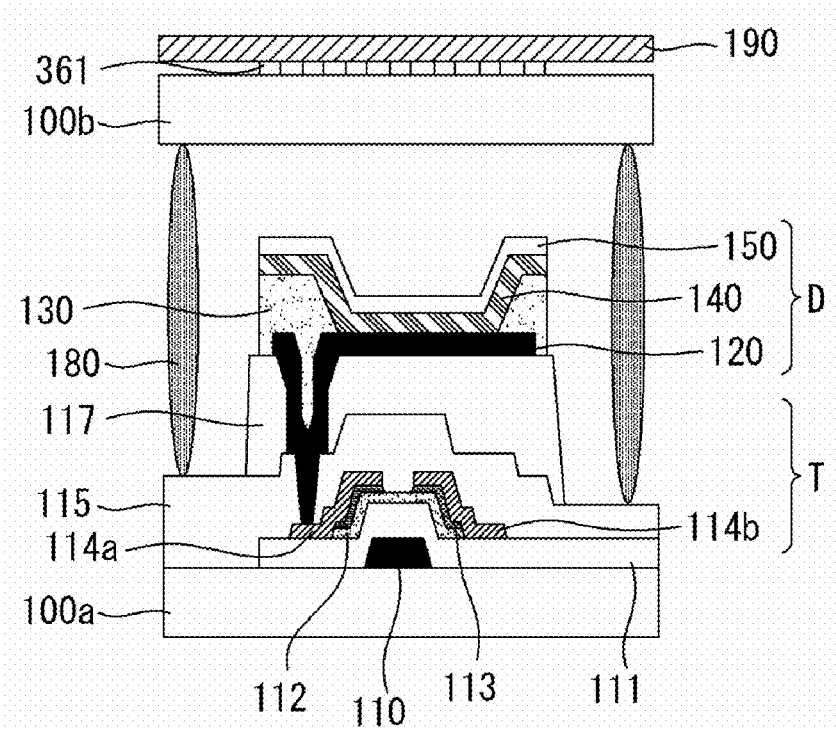
FIG. 7 is a diagram showing the structure of a panel according to a third embodiment of this document.

Referring to FIG. 7, the panel comprises subpixels disposed on one side of a first substrate 100a and lower electrode patterns 361 disposed on the other side of a second substrate 100b (i.e., a side not facing the subpixels). The first substrate 100a and the second substrate 100b are coalesced together and sealed by an adhesive member 180.

Meanwhile, the lower electrode patterns 361 are coupled to the sense unit as described above. Further, the lower electrode patterns 361 may be divided in plural numbers in respective lines corresponding to the subpixels, but not limited thereto. Here, the panel may comprise a protection layer 190 configured to cover the lower electrode patterns 361 and disposed on the other side of the second substrate 100b. The protection layer 190 may be made of a polarizing film, but not limited thereto.

In the above embodiment, the lower electrode patterns 361 are illustrated to have a one-dimensional single layer structure. However, the shape of the lower electrode patterns 361 is not limited to the one-dimensional single layer structure.

<Fourth Embodiment>

Figure 8:
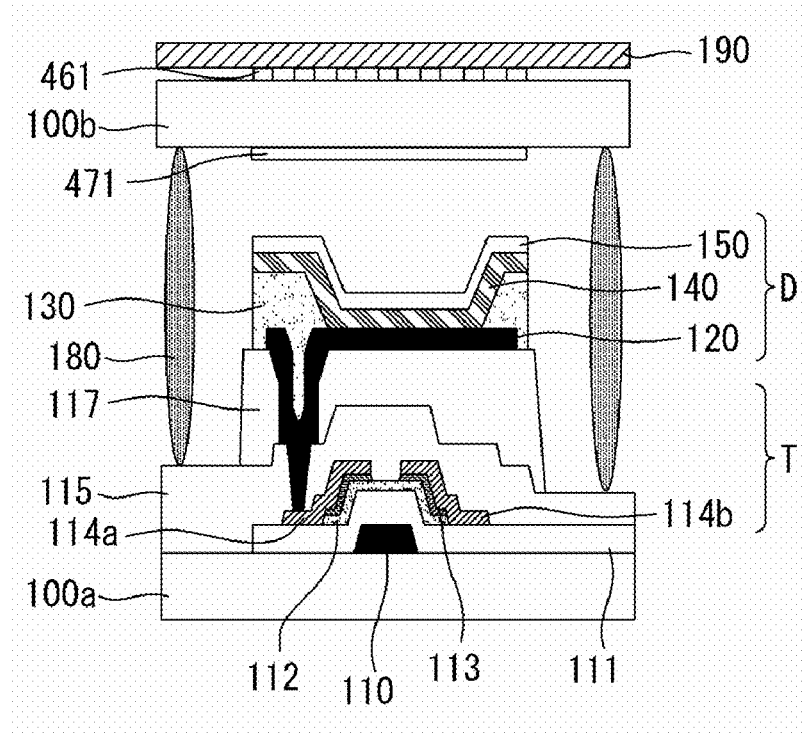
FIG. 8 is a diagram showing the structure of a panel according to a fourth embodiment of this document.

Referring to FIG. 8, the panel comprises subpixels disposed on one side of a first substrate 100a and lower electrode patterns 461 disposed on the other side of a second substrate 100b (i.e., a side not facing the subpixels). The first substrate 100a and the second substrate 100b are coalesced together and sealed by an adhesive member 180. The panel further comprises a ground electrode 471 disposed on one side of the second substrate 100b and coupled to a negative voltage source. The ground electrode 471 may play the role of a noise filter for preventing noise from being formed in the lower electrode patterns 461 when a user touches the panel. The ground electrode 471 may be formed using the same transparent material as the lower electrode patterns 461.

Meanwhile, the lower electrode patterns 461 are coupled to the sense unit as described above. Further, the lower electrode patterns 461 may be divided in plural numbers in respective lines corresponding to the subpixels, but not limited thereto. Here, the panel may comprise a protection layer 190 configured to cover the lower electrode patterns 461 and disposed on the other side of the second substrate 100b. The protection layer 190 may be made of a polarizing film, but not limited thereto.

In the above embodiment, the lower electrode patterns 461 are illustrated to have a one-dimensional single layer structure. However, the shape of the lower electrode patterns 461 is not limited to the one-dimensional single layer structure.

<Fifth Embodiment>

Figure 9:
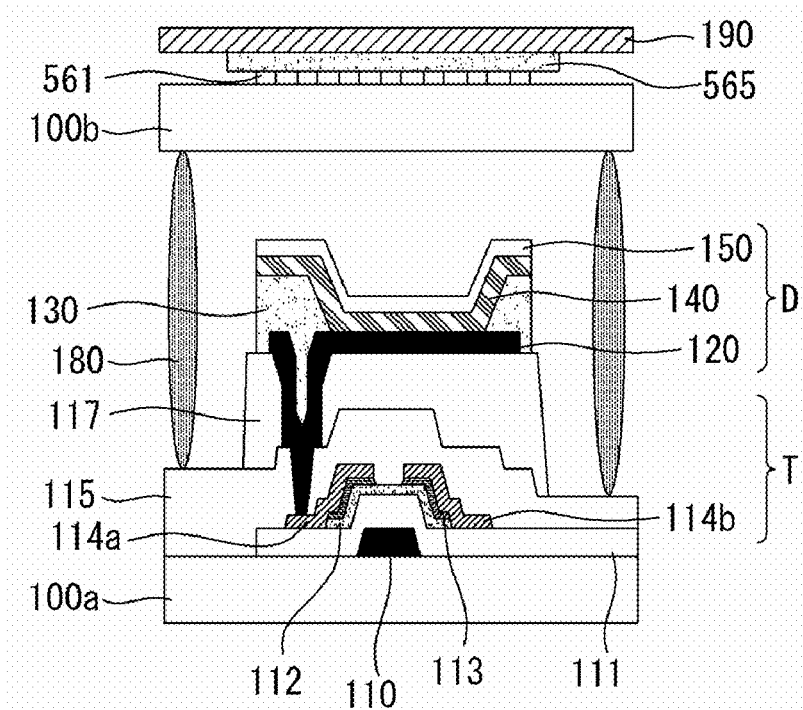
FIG. 9 is a diagram showing the structure of a panel according to a fifth embodiment of this document.

Referring to FIG. 9, the panel comprises subpixels disposed on one side of a first substrate 100a and lower electrode patterns 561 disposed on the other side of a second substrate 100b (i.e., a side not facing the subpixels). The first substrate 100a and the second substrate 100b are coalesced together and sealed by an adhesive member 180. The panel further comprises an insulating layer 565 configured to cover the lower electrode patterns 561 and disposed on the other side of the second substrate 100b.

Meanwhile, the lower electrode patterns 561 are coupled to the sense unit as described above. Further, the lower electrode patterns 561 may be divided in plural numbers in respective lines corresponding to the subpixels, but not limited thereto. Here, the panel may comprise a protection layer 190 configured to cover the insulating layer 565 and disposed on the other side of the second substrate 100b. The protection layer 190 may be made of a polarizing film, but not limited thereto.

In the above embodiment, the lower electrode patterns 561 are illustrated to have a one-dimensional single layer structure. However, the shape of the lower electrode patterns 561 is not limited to the one-dimensional single layer structure.

<Sixth Embodiment>

Figure 10:
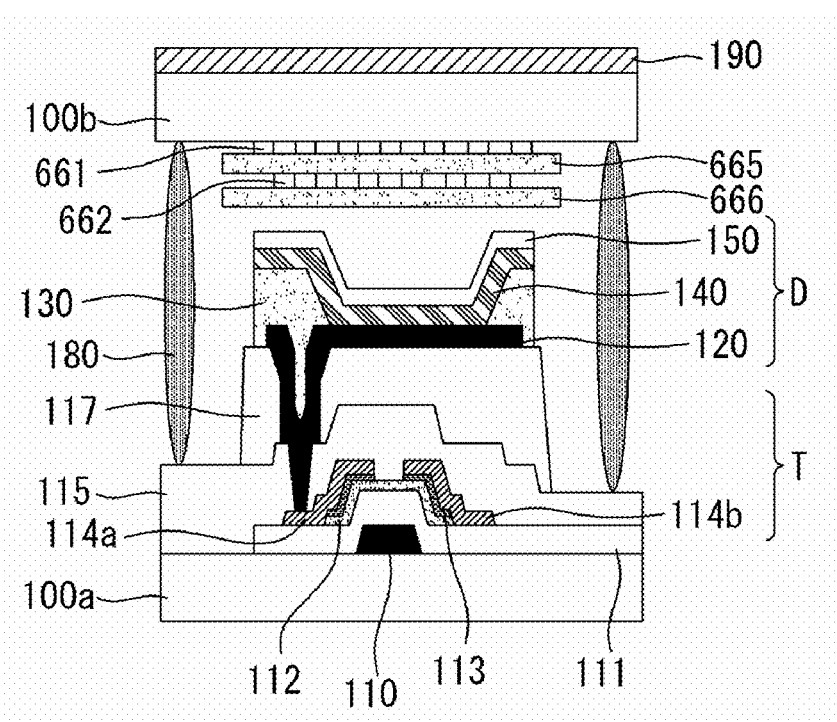
FIG. 10 is a diagram showing the structure of a panel according to a sixth embodiment of this document.

Referring to FIG. 10, the panel comprises subpixels, disposed on one side of a first substrate 100a, lower electrode patterns 661 disposed on one side of a second substrate 100b (i.e., a side facing the subpixels), a first insulating layer 665 disposed on the lower electrode patterns 661, upper electrode patterns 662 disposed on the first insulating layer 665, and a second insulating layer 666 disposed on the upper electrode patterns 662. The first substrate 100a and the second substrate 100b are coalesced together and sealed by an adhesive member 180.

Meanwhile, the lower and upper electrode patterns 661 and 662 are coupled to the sense unit as described above. The lower and upper electrode patterns 661 and 662 may be divided in plural numbers in respective lines corresponding to the subpixels, but not limited thereto. Here, the panel may comprise a protection layer 190 disposed on the other side of the second substrate 100b. The protection layer 190 may be made of a polarizing film, but not limited thereto.

In the above embodiment, the lower and upper electrode patterns 661 and 662 are illustrated to have a two-dimensional dual-layer structure. However, the shape of the lower and upper electrode patterns 661 and 662 is not limited to the two-dimensional dual-layer structure.

<Seventh Embodiment>

Figure 11:
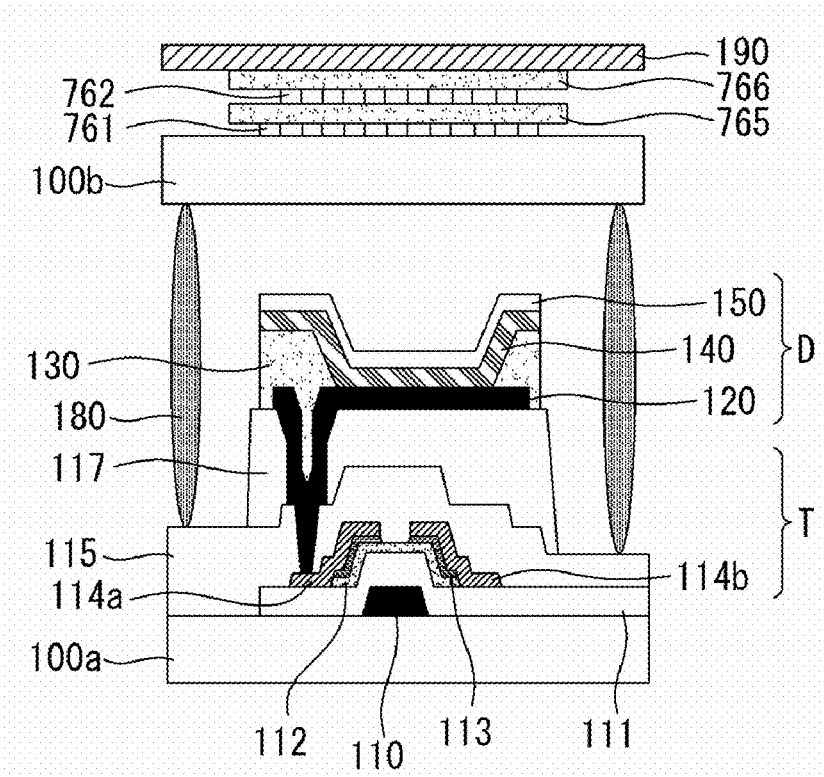
FIG. 11 is a diagram showing the structure of a panel according to a seventh embodiment of this document.

Referring to FIG. 11, the panel comprises subpixels, disposed on one side of a first substrate 100a, lower electrode patterns 761 disposed on the other side of a second substrate 100b (i.e., a side not facing the subpixels), a first insulating layer 765 disposed on the lower electrode patterns 761, upper electrode patterns 762 disposed on the first insulating layer 765, and a second insulating layer 766 disposed on the upper electrode patterns 762. The first substrate 100a and the second substrate 100b are coalesced together and sealed by an adhesive member 180.

Meanwhile, the lower and upper electrode patterns 761 and 762 are coupled to the sense unit as described above. The lower and upper electrode patterns 761 and 762 may be divided in plural numbers in respective lines corresponding to the subpixels, but not limited thereto. Here, the panel may comprise a protection layer 190 disposed on the other side of the second substrate 100b. The protection layer 190 may be made of a polarizing film, but not limited thereto.

In the above embodiment, the lower and upper electrode patterns 761 and 762 are illustrated to have a two-dimensional dual-layer structure. However, the shape of the lower and upper electrode patterns 761 and 762 is not limited to the two-dimensional dual-layer structure.

<Eighth Embodiment>

Figure 12:
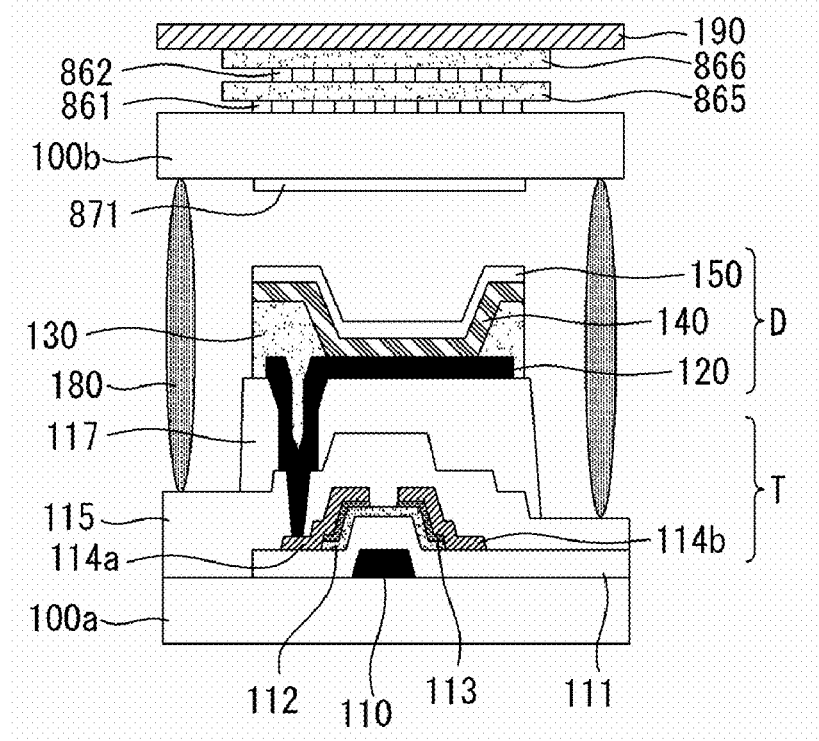
FIG. 12 is a diagram showing the structure of a panel according to an eighth embodiment of this document.

Referring to FIG. 12, the panel comprises subpixels disposed on one side of a first substrate 100a, lower electrode patterns 861 disposed on the other side of a second substrate 100b (i.e., a side not facing the subpixels), a first insulating layer 865 disposed on the lower electrode patterns 861, upper electrode patterns 862 disposed on the first insulating layer 865, and a second insulating layer 866 disposed on the upper electrode patterns 862. The first substrate 100a and the second substrate 100b are coalesced together and sealed by an adhesive member 180. The panel further comprises a ground electrode 871 disposed on one side of the second substrate 100b and coupled to a negative voltage source. The ground electrode 871 may play the role of a noise filter for preventing noise from being formed in the lower and upper electrode patterns 861 and 862 when a user touches the panel. The ground electrode 871 may be formed using the same transparent material as the lower and upper electrode patterns 861 and 862.

Meanwhile, the lower and upper electrode patterns 861 and 862 are coupled to the sense unit as described above. Further, the lower and upper electrode patterns 861 and 862 may be divided in plural numbers in respective lines corresponding to the subpixels, but not limited thereto. Here, the panel may comprise a protection layer 190 disposed on the other side of the second substrate 100b. The protection layer 190 may be made of a polarizing film, but not limited thereto.

In the above embodiment, the lower and upper electrode patterns 861 and 862 are illustrated to have a two-dimensional dual-layer structure. However, the shape of the lower and upper electrode patterns 861 and 862 is not limited to the two-dimensional dual-layer structure.

<Ninth Embodiment>

Figure 13:
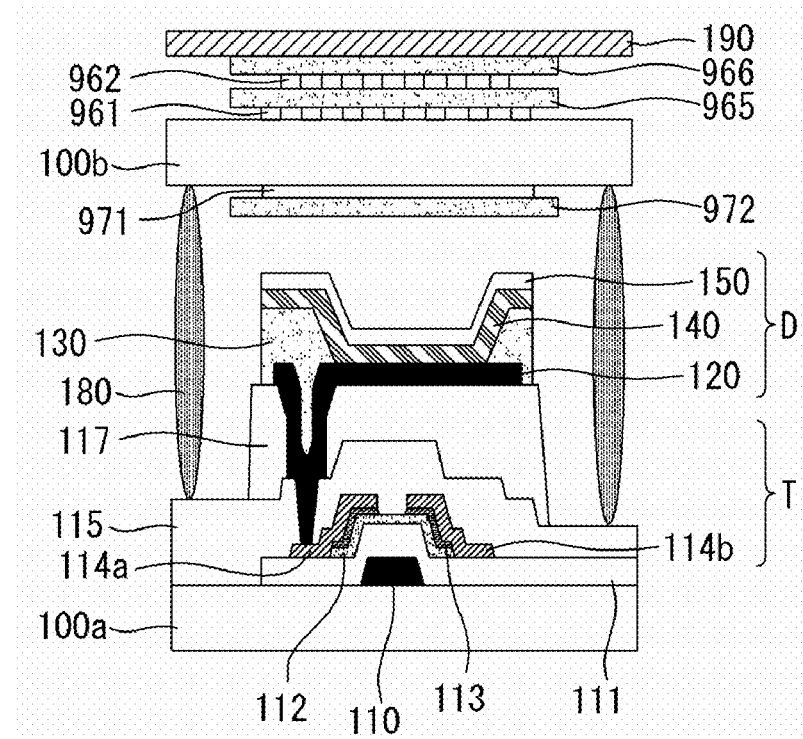
FIG. 13 is a diagram showing the structure of a panel according to a ninth embodiment of this document.

Referring to FIG. 13, the panel comprises subpixels disposed on one side of a first substrate 100a, lower electrode patterns 961 disposed on the other side of a second substrate 100b (i.e., a side not facing the subpixels), a first insulating layer 965 disposed on the lower electrode patterns 961, upper electrode patterns 962 disposed on the first insulating layer 965, and a second insulating layer 966 disposed on the upper electrode patterns 962. The first substrate 100a and the second substrate 100b are coalesced together and sealed by an adhesive member 180. The panel further comprises a ground electrode 971, disposed on one side of the second substrate 100b and coupled to a negative voltage source, and a coating layer 972 disposed on the ground electrode 971. The ground electrode 971 may play the role of a noise filter for preventing noise from being formed in the lower and upper electrode patterns 961 and 962 when a user touches the panel. Further, the coating layer 972 may play the role of an insulating film for preventing short between the ground electrode 971 and an upper electrode 150 of the subpixels when a user touches the panel.

Meanwhile, the lower and upper electrode patterns 961 and 962 are coupled to the sense unit as described above. Further, the lower and upper electrode patterns 961 and 962 may be divided in plural numbers in respective lines corresponding to the subpixels, but not limited thereto. Here, the panel may comprise a protection layer 190 disposed on the other side of the second substrate 100b. The protection layer 190 may be made of a polarizing film, but not limited thereto.

In the above embodiment, the lower and upper electrode patterns 961 and 962 are illustrated to have a two-dimensional dual-layer structure. However, the shape of the lower and upper electrode patterns 961 and 962 is not limited to the two-dimensional dual-layer structure.

The subpixels shown in the first to ninth embodiments are described below.

Referring to any one of FIGS. 5-13, The subpixel may comprise a transistor unit T, comprising a switching transistor, a driving transistor, and a capacitor, and an organic light-emitting diode D coupled to the transistor unit T, but not limited thereto. Here, the switching transistor may play the role of a switch in response to a scan signal. The driving transistor may drive the organic light-emitting diode in response to a data signal. The capacitor may store a data signal in the form of a data voltage. Further, the organic light-emitting diode may emit light when the driving transistor operates.

When the transistors included in the transistor unit T have a bottom gate type, driving transistors 110, 112, 113, 114a, and 114b and the organic light-emitting diode D may be configured as follows.

The gate 110 may be disposed on one side of the first substrate 100a. The gate 110 may be made of one selected from the group consisting of molybdenum (Mo), aluminum (Al), chrome (Cr), gold (Au), titanium (Ti), nickel (Ni), neodymium (Nd), and copper (Cu), or an alloy thereof. Alternatively, the gate 110 may be either a single layer, selected from the group consisting of molybdenum (Mo), aluminum (Al), chrome (Cr), gold (Au), titanium (Ti), nickel (Ni), neodymium (Nd), and copper (Cu), or a multilayer formed of an alloy thereof. Alternatively, the gate 110 may be a dual layer of Mo/Al—Nd or Mo/Al.

A gate insulating layer 111 may be disposed on the gate 110. The gate insulating layer 111 may be a single layer, made of silicon oxide (SiOx) or silicon nitride (SiNx), or a multilayer thereof. However, the gate insulating layer 111 is not limited thereto.

An active layer 112 is disposed on the gate insulating layer 111. The active layer 112 may comprise amorphous silicon or polycrystalline silicon which is crystallized amorphous silicon. Although it is not shown, the active layer 112 may comprise a source area, a channel area, and a drain area. An ohmic contact layer 113 may be disposed on the active layer 112.

A source 114a and a drain 114b, respectively coupled to the source area and the drain area, may be disposed on the active layer 112. The source 114a and the drain 114b may be formed of a single layer or a multilayer. If the source 114a and the drain 114b have a single layer, the source 114a and the drain 114b may be made of any one selected from the group consisting of molybdenum (Mo), aluminum (Al), chrome (Cr), gold (Au), titanium (Ti), nickel (Ni), neodymium (Nd), and copper (Cu), or an alloy thereof. If the source 114a and the drain 114b have a multilayer, the source 114a and the drain 114b may be formed of a dual layer of Mo/AlNd or a triple layer of Mo/Al/Mo or Mo/AlNd/Mo.

A first passivation layer 115 may be disposed on the source 114a and the drain 114b. The first passivation layer 115 may be formed of a single layer, such as silicon oxide (SiOx) or silicon nitride (SiNx), or a multilayer thereof, but not limited thereto.

A second passivation layer 117 may be disposed on the first passivation layer 115. The second passivation layer 117 may be formed of a single layer, such as silicon oxide (SiOx) or silicon nitride (SiNx), or a multi-layer thereof, but not limited thereto.

A lower electrode 120 coupled to the source 114a or the drain 114b may be disposed on the third insulating film 117. The lower electrode 120 may be selected as a cathode or an anode. If the lower electrode 120 is selected as the cathode, the cathode may be made of any one selected from aluminum (Al), an aluminum gold (Al alloy), and AlNd, but not limited thereto. Further, if the lower electrode 120 is selected as the cathode, it is advantageous that the cathode is made of material having a high reflectance.

A bank layer 130 may be disposed on the lower electrode 120. The bank layer 130 has an opening through which part of the lower electrode 120 is exposed. The bank layer 130 may be made of an organic material, such as benzocyclobutene (BCB) resin, acrylic resin, or polyimide resin, but not limited thereto.

Figure 14:
FIG. 14 is an exemplary view showing the hierarchical structure of an organic light-emitting diode.

An organic light-emitting layer 140 may be disposed on the lower electrode 120. The organic light-emitting layer 140 may comprise a hole injection layer 140a, a hole transport layer 140b, an emission layer 140c, an electron transport layer 140d, and an electron injection layer 140e. Referring to FIG. 14, the hole injection layer 140a may function to make smooth the injection of holes. The hole injection layer 140a may be made of one or more selected from the group consisting of CuPc (cupper phthalocyanine), PEDOT(poly(3,4)-ethylenedioxythiophene), PANl(polyaniline), and NPD(N,N-dinaphthyl-N,N'-diphenyl benzidine), but not limited thereto. The hole transport layer 140b functions to make smooth the transport of holes. The hole transport layer 140b may be made of one or more selected from the group consisting of NPD(N, N-dinaphthyl-N,N'-diphenyl benzidine), TPD(N,N'-bis-(3-methylphenyl)-N,N'-bis-(phenyl)-benzidine), s-TAD, and MTDATA(4,4',4''-Tris(N-3-methylphenyl-N-phenyl-amino)-triphenylamine), but not limited thereto. The emission layer 140c may comprise material that emits red, green, blue, or white light or may be made of a phosphorescent or fluorescent material. If the emission layer 140c is made of material that emits red light, the emission layer 140c may be made of a phosphorescent material, comprising a host material having carbazole biphenyl (CBP) or 1,3-bis(carbazol-9-yl) mCP and a dopant having one or more selected from the group consisting of PlQlr(acac)(bis(1-phenylisoquinoline) acetylacetonate iridium), PQlr(acac)(bis(1-phenylquinoline) acetylacetonate iridium), PQlr(tris(1-phenylquinoline)iridium), and PtOEP(octaethylporphyrin platinum). Alternatively, the emission layer 140c may be made of a fluorescent material comprising PBD:Eu(DBM)3(Phen) or Perylene, but not limited thereto. If the emission layer 140c is made of material that emits blue light, the emission layer 140c may be made of a phosphorescent material, comprising a host material having CBP or mCP and a dopant material having (4,6-F2ppy)2lrpic. Alternatively, the emission layer 140c may be made of a fluorescent material comprising any one selected from the group consisting of spiro-DPVBi, spiro-6P, distryrylbenzene (DSB), distyrylarylene (DSA), PFO polymer, and PPV polymer, but not limited thereto. The electron transport layer 140d functions to make smooth the transport of electrons. The electron transport layer 140d may be made of one or more selected from the group consisting of Alq3 (tris(8-hydroxyquinolino)aluminum), PBD, TAZ, spiro-PBD, BAlq, and SAlq, but not limited thereto. The electron injection layer 140e functions to make smooth the injection of electrons. The electron injection layer 140e may be made of Alq3(tris(8-hydroxyquinolino)aluminum), PBD, TAZ, spiro-PBD, BAlq or SAlq, but not limited thereto. In this case, the embodiments of this document are not limited to FIG. 14, and at least one of the hole injection layer 140a, the hole transport layer 140b, the electron transport layer 140d, and the electron injection layer 140e may be omitted.

An upper electrode 150 may be disposed on the organic light-emitting layer 140. The upper electrode 150 may be selected as an anode or a cathode. Here, the upper electrode 150 selected as the anode may be made of any one selected from the group consisting of ITO (Indium Tin Oxide), IZO (Indium Zinc Oxide), ITZO (Indium Tin Zinc Oxide), and AZO ($Al_2O_3$ doped ZnO), but not limited thereto.

As described above, the OLED device according to the embodiments of the invention may have a function of the touch screen panel using the electrode patterns on the panel. Furthermore, in the OLED device according to the embodiments of the invention, because the electrode patterns driven in a capacitance manner and the panel form an integral body, a function of the touch screen panel capable of performing the multi-touch operation may be provided so as to reduce the manufacturing cost.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An organic light emitting diode (OLED) display comprising:
    a panel comprising subpixels, disposed on one side of a first substrate, and electrode patterns disposed on a second substrate, wherein the first substrate and the second substrate are attached to each other, and wherein the electrode patterns are disposed on a side of the second substrate that opposites to the first substrate;
    a driving unit coupled to the subpixels and configured to supply a scan signal and a data signal to the subpixels; and
    a sense unit coupled to the electrode patterns and configured to detect a position based on a change in a capacitance formed in the electrode patterns when a user touches the panel,
    wherein the panel comprises:
        a ground electrode directly disposed on a side of the second substrate that faces the first substrate and coupled to a negative voltage source,
        wherein the ground electrode is a noise filter for preventing noise from being formed in the electrode patterns,
        wherein the panel further comprises a coating layer directly disposed on the ground electrode, and
        wherein the coating layer is an insulating film for preventing short between the ground electrode and an upper electrode of the subpixels.

2. The OLED display of claim 1, wherein the panel comprises a protection layer configured to cover the electrode patterns.

3. The OLED display of claim 2, wherein the panel comprises an insulating layer disposed between the electrode patterns and the protection layer.

4. The OLED display of claim 1, wherein the electrode patterns comprises lower electrode patterns and upper electrode patterns, and
    the panel further comprises:
        a first insulating layer disposed between the lower electrode patterns and the protection layer;
        wherein the upper electrode patterns are disposed on the first insulating layer and disposed in respective areas not overlapping the lower electrode patterns.

5. The OLED display of claim 4, wherein the panel further comprises a second insulating layer disposed on the upper electrode patterns.

* * * * *